(12) United States Patent
Azuhata (10) Patent No.: US 10,367,458 B2
(45) Date of Patent: Jul. 30, 2019

(54) SIGNAL AMPLIFIER

(71) Applicant: Panasonic Intellectual Property Management Co., Ltd., Osaka (JP)

(72) Inventor: Satoshi Azuhata, Tokyo (JP)

(73) Assignee: PANASONIC INTELLECTUAL PROPERTY MANANGEMENT CO., LTD., Osaka (JP)

( * ) Notice: Subject to any disclaimer, the term of this patent is extended or adjusted under 35 U.S.C. 154(b) by 0 days.

(21) Appl. No.: 15/933,444

(22) Filed: Mar. 23, 2018

(65) Prior Publication Data
US 2018/0287574 A1  Oct. 4, 2018

(30) Foreign Application Priority Data

Mar. 31, 2017  (JP) .................................. 2017-069934

(51) Int. Cl.
| H03F 3/38 | (2006.01) |
| H03F 3/217 | (2006.01) |
| H03F 3/45 | (2006.01) |
| H03M 1/50 | (2006.01) |

(52) U.S. Cl.
CPC .......... *H03F 3/217* (2013.01); *H03F 3/2171* (2013.01); *H03F 3/2173* (2013.01); *H03F 3/45475* (2013.01); *H03F 2200/03* (2013.01); *H03F 2200/279* (2013.01); *H03F 2200/351* (2013.01); *H03M 1/504* (2013.01)

(58) Field of Classification Search
CPC .................................. H03F 3/38; H03F 3/217
USPC ....................................... 330/10, 207 A, 251
See application file for complete search history.

(56) References Cited

U.S. PATENT DOCUMENTS

| 5,805,020 A * | 9/1998 | Danz .................... H03F 3/2171 330/10 |
| 7,076,070 B2 * | 7/2006 | Pearce ................ H01L 21/8234 257/368 |
| 7,332,962 B2 * | 2/2008 | Wu ....................... H03F 3/2173 330/10 |
| 7,355,473 B2 * | 4/2008 | Wu ....................... H03F 3/2173 330/10 |
| 7,528,651 B2 * | 5/2009 | Honda .................... H03F 1/26 330/10 |

(Continued)

FOREIGN PATENT DOCUMENTS

JP  2004-048333  2/2004

*Primary Examiner* — Henry Choe
(74) *Attorney, Agent, or Firm* — Greenblum & Bernstein, P.L.C.

(57) ABSTRACT

A signal amplifier includes a pulse width modulator, a level shifter, and a power amplifier. The pulse width modulator is driven by a positive power supply and a negative power supply, and a reference voltage of the pulse width modulator is set to a GND. The power amplifier is driven by a positive power supply, and a reference voltage of the power amplifier is set to a middle value between the positive power supply and the GND. The level shifter shifts a voltage level of a first PWM signal whose high level corresponds to the positive power supply of the pulse width modulator and whose low level corresponds to the negative power supply of the pulse width modulator, to a voltage level of a second PWM signal whose high level corresponds to the positive power supply of the power amplifier and whose low level corresponds to the GND.

1 Claim, 10 Drawing Sheets

(56) References Cited

U.S. PATENT DOCUMENTS 7,800,444 B2 * 9/2010 Tsukamoto ............... H03F 1/26
330/10

* cited by examiner

SIGNAL AMPLIFIER

The present application claims the benefit of foreign priority of Japanese patent application 2017-069934 filed on Mar. 31, 2017, the contents all of which are incorporated herein by reference.

BACKGROUND

1. Technical Field

The present disclosure relates to a signal amplifier used for a vehicle-mounted audio device.

2. Description of the Related Art

Figure 8:
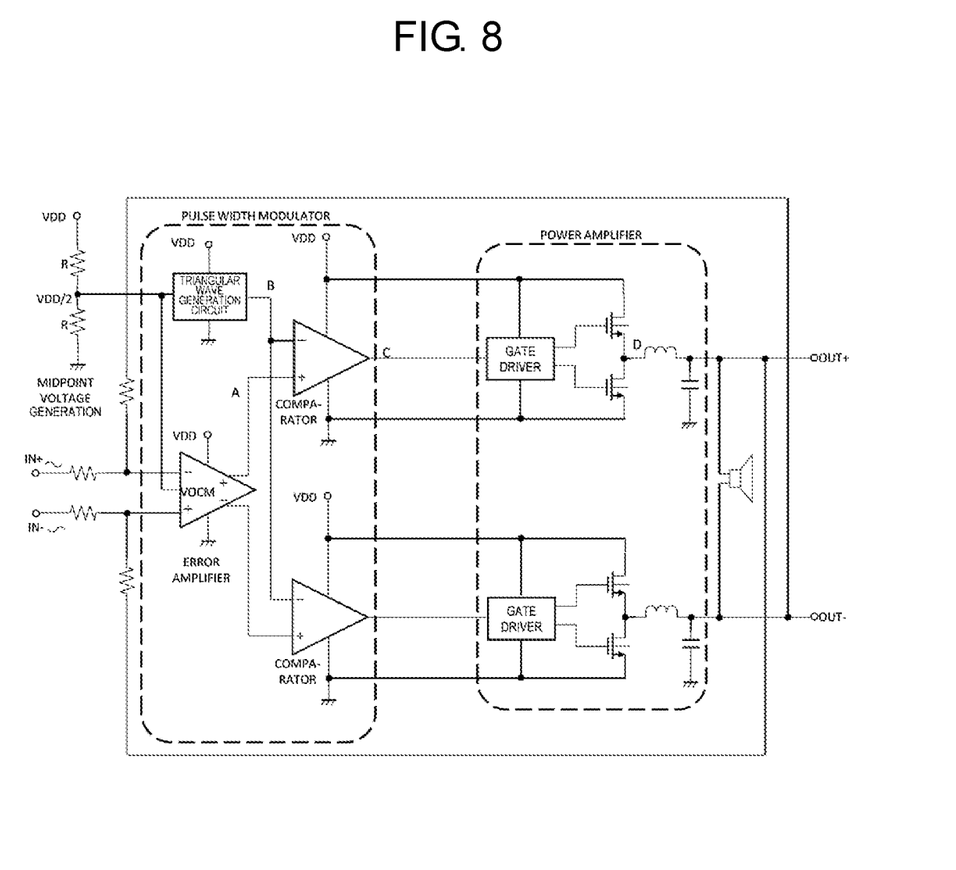
FIG. 8 is a circuit diagram illustrating an example of a conventional signal amplifier.
Figure 9:
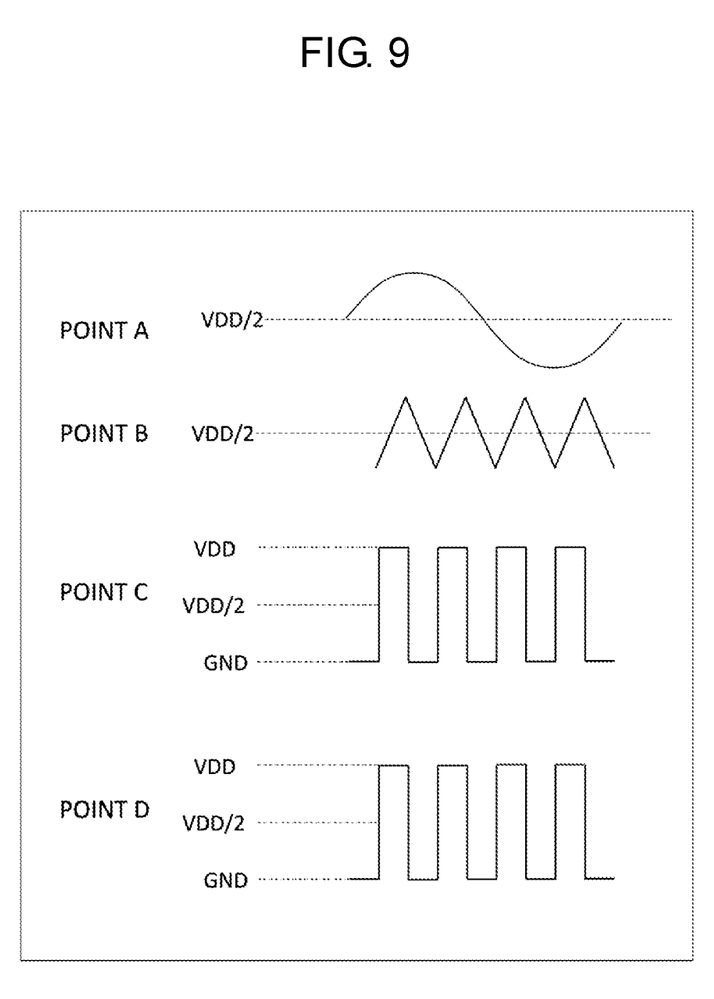
FIG. 9 is a diagram illustrating voltage waveforms of respective points (points A to D) in FIG. 8.

Conventionally, in a vehicle-mounted audio device, a class-D audio amplifier has been used as a signal amplifier (refer to Unexamined Japanese Patent Publication No. 2004-48333, for example). In the class-D audio amplifier, it is necessary to generate a reference voltage used as a reference of amplification. Various circuit configurations are proposed to generate the reference voltage. For example, as illustrated in FIG. 8, when a circuit configuration with a single power supply is used to generate the reference voltage, the reference voltage is equal to a midpoint voltage between a positive power supply (VDD) and a ground (GND) (refer to FIG. 9).

SUMMARY

The present disclosure provides a signal amplifier that can prevent occurrence of noise or an increase in output impedance caused by use of a midpoint voltage as a reference voltage to prevent an adverse effect on an audio characteristic. The signal amplifier can also prevent degradation of power efficiency and an increase in cost and circuit area that are caused by use of a negative power supply that supplies a large current.

A signal amplifier according to the present disclosure includes a signal input unit, a pulse width modulator, a level shifter, a power amplifier, and a signal output unit. An analog input signal is input to the signal input unit. The pulse width modulator performs pulse width modulation on the analog input signal input to the signal input unit to convert the analog input signal into a first pulse width modulation (PWM) signal. The level shifter shifts a voltage level of the first PWM signal output from the pulse width modulator to convert the first PWM signal into a second PWM signal. The power amplifier performs power amplification on the second PWM signal output from the level shifter to generate an analog output signal from the second PWM signal. The signal output unit outputs the analog output signal. The pulse width modulator is driven by a positive power supply and a negative power supply, and a reference voltage of the pulse width modulator is set to a GND. The power amplifier is driven by a positive power supply, and a reference voltage of the power amplifier is set to a middle value between the positive power supply and the GND. The level shifter shifts the voltage level of the first PWM signal whose high level corresponds to the positive power supply of the pulse width modulator and whose low level corresponds to the negative power supply of the pulse width modulator, to a voltage level of the second PWM signal whose high level corresponds to the positive power supply of the power amplifier and whose low level corresponds to the GND.

With this configuration, the pulse width modulator performs the pulse width modulation with the GND as a reference voltage. Therefore, this configuration can prevent occurrence of noise or an increase in output impedance caused by use of a midpoint voltage as the reference voltage to prevent an adverse effect on an audio characteristic. On the other hand, the power amplifier performs the power amplification with only the positive power supply (single power supply). It is therefore unnecessary to use a negative power supply that supplies a large current, resulting in that degradation of power efficiency and an increase in cost and circuit area can be prevented.

Further, the signal amplifier according to the present disclosure may include an error amplification unit to which the analog input signal is input and to which the analog output signal output from the signal output unit is input by being fed back. The error amplification unit may output an error amplification signal that is generated by amplifying an error component between the analog input signal input to the error amplification unit and the analog output signal fed back and input to the error amplification unit. The pulse width modulator may output the first PWM signal having a pulse width corresponding to a signal level of the error amplification signal.

With this configuration, the analog output signal is input to the error amplification unit by being fed back, and the error amplification signal that is generated by amplifying the error component between the analog input signal and the analog output signal is output. The pulse width modulation having the pulse width corresponding to the signal level of the error amplification signal is then performed. This configuration can achieve feedback control.

Further, in the signal amplifier according to the present disclosure, the analog input signal of a differential form may be input to the signal input unit, and the analog output signal of the differential form may be output from the signal output unit.

With this configuration, when the analog input signal of the differential form is input from the signal input unit, the analog output signal of the differential form is output from the signal output unit. This configuration can achieve a differential-input/differential-output amplifier.

Further, in the signal amplifier according to the present disclosure, the analog input signal of a single-ended form may be input to the signal input unit, and the analog output signal of a differential form may be output from the signal output unit.

With this configuration, when the analog input signal of the single-ended form is input from the signal input unit, the analog output signal of the differential form is output from the signal output unit. This configuration can achieve a single-ended-input/differential-output amplifier.

Further, in the signal amplifier according to the present disclosure, the analog input signal of a single-ended form may be input to the signal input unit, and the analog output signal of a single-ended form may be output from the signal output unit.

With this configuration, when the analog input signal of the single-ended form is input from the signal input unit, the analog output signal of the single-ended form is output from the signal output unit. This configuration can achieve a single-ended-input/single-ended-output amplifier.

The present disclosure can prevent occurrence of noise or an increase in output impedance caused by use of a midpoint voltage as a reference voltage to prevent an adverse effect on an audio characteristic. The present disclosure can also prevent degradation of power efficiency and an increase in cost and circuit area that are caused by use of a negative power supply that supplies a large current.

DETAILED DESCRIPTION

Prior to describing exemplary embodiments of the present disclosure, problems found in a conventional technique will be now briefly described herein. When a circuit configuration with a single power supply is used to generate a reference voltage, as in a conventional signal amplifier (when the reference voltage is equal to a midpoint voltage between VDD and GND), the reference voltage is typically generated by using a resistance voltage divider or an output of a buffer configured with an operational amplifier. Therefore, the reference voltage tends to be unstable. This causes problems such as occurrence of noise or an increase in output impedance, thereby exerting an adverse effect on an audio characteristic.

Figure 10:
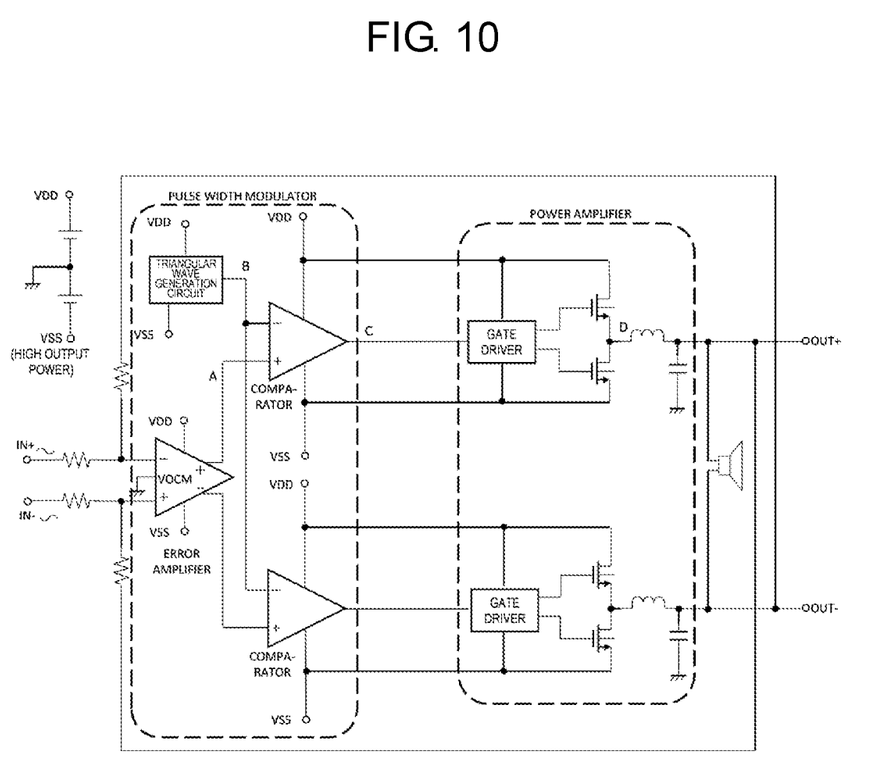
FIG. 10 is a circuit diagram illustrating another example of the conventional signal amplifier.

Hence, as illustrated in FIG. 10, a simple circuit configuration with positive and negative power supplies is conceivably used to generate the reference voltage. However, in this case, a negative power supply (VSS) that supplies a large current to a power amplifier (power stage) for driving a loud speaker is needed. This causes degradation of power efficiency and an increase in cost and circuit area, which are problems.

Signal amplifiers according to the exemplary embodiments of the present disclosure will be described below with reference to the accompanying drawings. In the present exemplary embodiments, a case of a signal amplifier (class-D audio amplifier) used for a vehicle-mounted audio device and the like will be illustrated.

First Exemplary Embodiment

Figure 1:
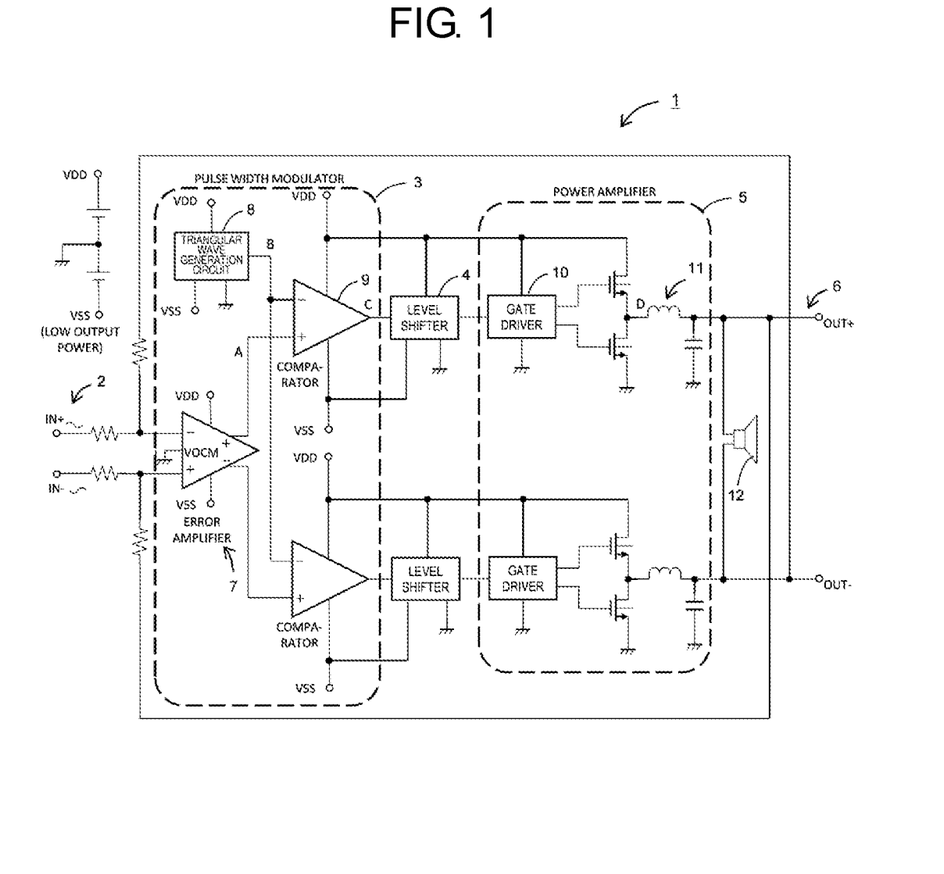
FIG. 1 is a circuit diagram illustrating an example of a signal amplifier according to a first exemplary embodiment of the present disclosure.

A configuration of a signal amplifier according to a first exemplary embodiment of the present disclosure will be described below with reference to the accompanying drawings. FIG. 1 is a circuit diagram illustrating an example of the signal amplifier according to the present exemplary embodiment. As illustrated in FIG. 1, signal amplifier 1 includes signal input unit 2, pulse width modulator 3 (low power unit), level shifter 4, power amplifier 5 (power stage), and signal output unit 6. An analog input signal of a differential form (input differential signals IN+, IN−) is input to signal input unit 2. An analog output signal of a differential form (output differential signals OUT+, OUT−) is output from signal output unit 6. Accordingly, signal amplifier 1 can be referred to as a differential-input/differential-output amplifier. Note that the analog input signal (input differential signals IN+, IN−) is a signal with GND as a reference. Further, signal amplifier 1 includes a positive power supply (VDD) and a negative power supply (VSS).

Pulse width modulator 3 includes error amplifier 7 (error amplification unit), triangular wave generation circuit 8, and comparator 9. The analog input signal from signal input unit 2 is input to error amplifier 7 and the analog output signal output from signal output unit 6 is input to error amplifier 7 by being fed back. Error amplifier 7, which serves as an error amplification unit is driven by the positive power supply (VDD) and the negative power supply (VSS), and outputs an error amplification signal generated by amplifying an error component between the analog input signal and the analog output signal (refer to point A of FIG. 2). In this case, error amplifier 7 is configured with a fully-differential operational amplifier. Note that the error amplification signal output from error amplifier 7 is a signal with GND as a reference. The error amplification signal can be referred to as an analog input signal generated by amplifying the error component.

Figure 2:
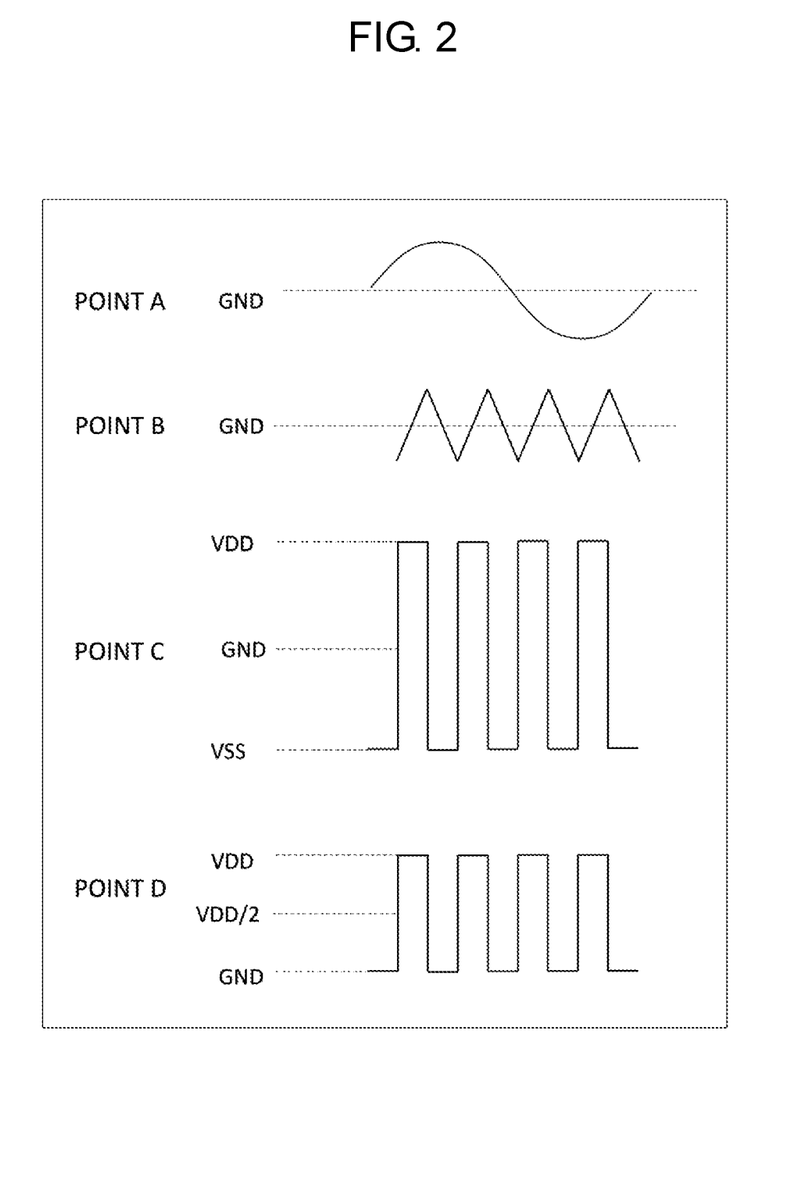
FIG. 2 is a diagram illustrating voltage waveforms of respective points (points A to D) in FIG. 1.

Triangular wave generation circuit 8 is driven by the positive power supply (VDD) and the negative power supply (VSS), and generates a triangular wave signal (refer to point B of FIG. 2). The triangular wave signal is a signal with GND as a reference. The error amplification signal output from error amplifier 7 and the triangular wave output from triangular wave generation circuit 8 are input to comparator 9. Comparator 9 compares the error amplification signal with the triangular wave to generate a pulse width modulation signal (first PWM signal) (refer to point C of FIG. 2). The pulse width modulation signal (first PWM signal) is a signal having a pulse width corresponding to a signal level of the error amplification signal. In other words, comparator 9 (pulse width modulator 3) performs pulse width modulation on the error amplification signal (the analog input signal generated by amplifying the error component) to convert the error amplification signal (the analog input signal generated by amplifying the error component) into the pulse width modulation signal (first PWM signal).

Level shifter 4 is disposed between pulse width modulator 3 and power amplifier 5. Level shifter 4 shifts a voltage level of the pulse width modulation signal (first PWM signal) that is driven by the positive power supply (VDD) and the negative power supply (VSS) and is output from pulse width modulator 3, to convert the voltage level into a voltage level of a pulse width modulation signal (second PWM signal) to be output to power amplifier 5. Specifically, the voltage level of the first PWM signal whose high level corresponds to positive power supply VDD of pulse width modulator 3 and whose low level corresponds to negative power supply VSS of pulse width modulator 3 is shifted to the voltage level of second PWM signal whose high level corresponds to positive power supply VDD of power amplifier 5 and whose low level corresponds to GND (refer to point D of FIG. 2).

Power amplifier 5 is configured with gate driver 10 and power transistors 11. Power amplifier 5 has no negative power supply, and is driven by only positive power supply VDD. Power amplifier 5 performs the power amplification on the pulse width modulation signal (second PWM signal) output from level shifter 4, and generates an analog output signal to be output to signal output unit 6. A reference voltage of power amplifier 5 is set to a middle value (VDD/2) between positive power supply VDD and GND (refer to point D of FIG. 2). The analog output signal is output to loud speaker 12, for example.

According to signal amplifier 1 of the first exemplary embodiment having such a configuration, pulse width modulator 3 performs the pulse width modulation with GND as a reference voltage. This can prevent occurrence of noise or an increase in output impedance caused by use of the midpoint voltage as the reference voltage, thereby preventing an adverse effect on an audio characteristic. On the other hand, power amplifier 5 performs the power amplification with only positive power supply VDD (single power supply). It is therefore unnecessary to use a negative power supply that supplies a large current as in conventional configurations, resulting in that degradation of power efficiency and an increase in cost and circuit area can be prevented.

In the present exemplary embodiment, feedback control can be achieved. In other words, the analog output signal is fed back and is input to error amplifier 7, to output the error amplification signal generated by amplifying the error component between the analog input signal and the analog output signal. The pulse width modulation having the pulse width corresponding to the signal level of the error amplification signal is then performed.

In the present exemplary embodiment, the differential-input/differential-output amplifier can be achieved. In other words, when the analog input signal of the differential form is input from signal input unit 2, the analog output signal of the differential form is output from signal output unit 6.

Other Exemplary Embodiments

Subsequently, signal amplifier 1 according to other exemplary embodiments of the present disclosure will be described below. Herein, description will be made focusing on differences between signal amplifier 1 according to the other exemplary embodiments and that of the first exemplary embodiment. Unless specifically mentioned, configurations and operations of the other exemplary embodiments are similar to those of the first exemplary embodiment.

Figure 3:
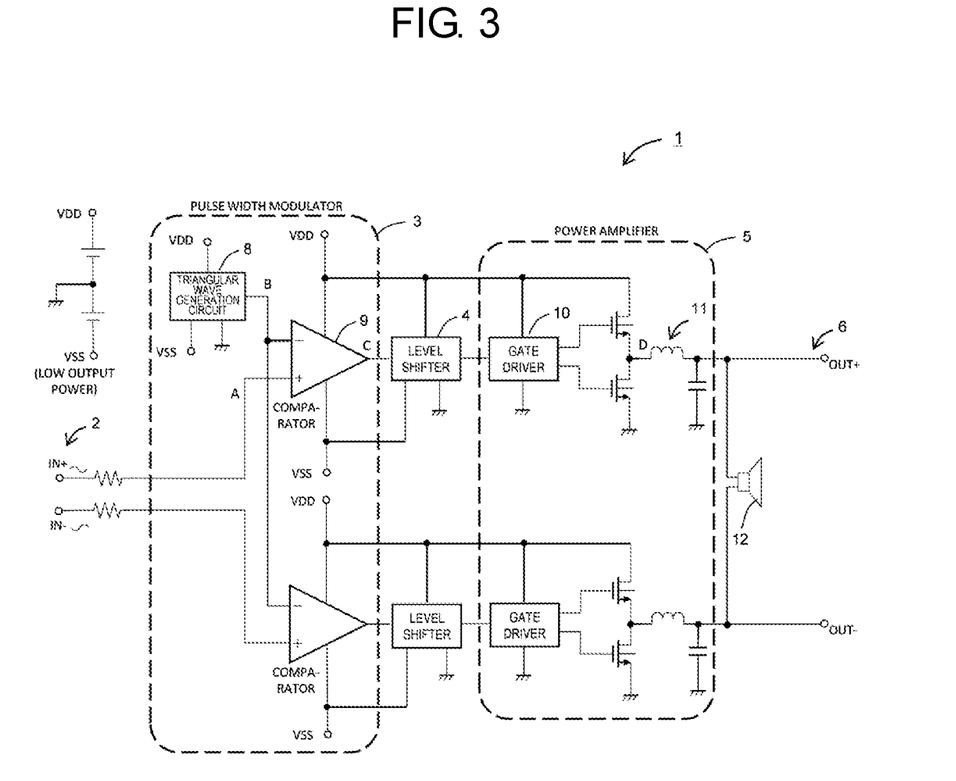
FIG. 3 is a circuit diagram illustrating an example of a signal amplifier according to a second exemplary embodiment of the present disclosure.

FIG. 3 is a circuit diagram illustrating an example of signal amplifier 1 according to a second exemplary embodiment. As illustrated in FIG. 3, the feedback control is not performed in signal amplifier 1 according to the second exemplary embodiment. Accordingly, signal amplifier 1 has not error amplifier 7, and an analog input signal is directly input to comparator 9 of pulse width modulator 3.

Signal amplifier 1 according to the second exemplary embodiment can also exert an effect similar to the first exemplary embodiment.

Figure 4:
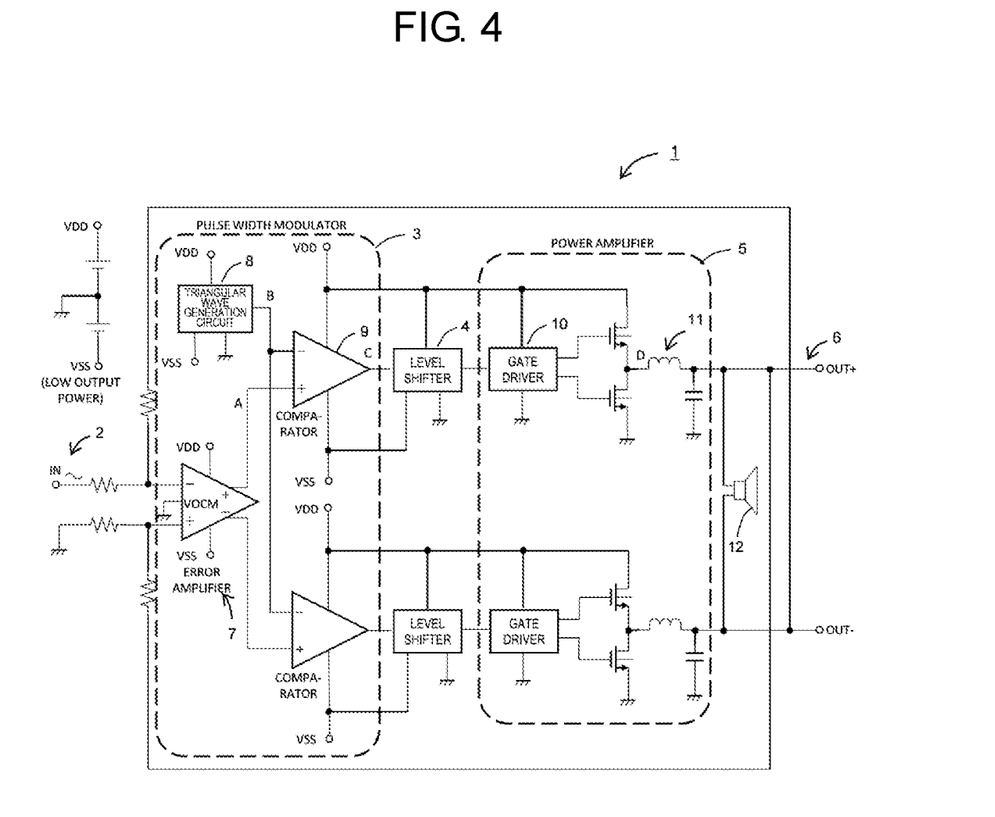
FIG. 4 is a circuit diagram illustrating an example of a signal amplifier according to a third exemplary embodiment of the present disclosure.

FIG. 4 is a circuit diagram illustrating an example of signal amplifier 1 according to a third exemplary embodiment. As illustrated in FIG. 4, in signal amplifier 1 according to the third exemplary embodiment, an analog input signal of a single-ended form (input differential signal IN) is input to signal input unit 2, and an analog output signal of a differential form (output differential signals OUT+, OUT−) is output from signal output unit 6. Accordingly, signal amplifier 1 can be referred to as a single-ended-input/differential-output amplifier.

Signal amplifier 1 according to the third exemplary embodiment can also exert an effect similar to the first exemplary embodiment. In the present exemplary embodiment, the single-ended-input/differential-output amplifier can be achieved. In other words, when the analog input signal of the single-ended form is input from signal input unit 2, the analog output signal of the differential form is output from signal output unit 6.

Figure 5:
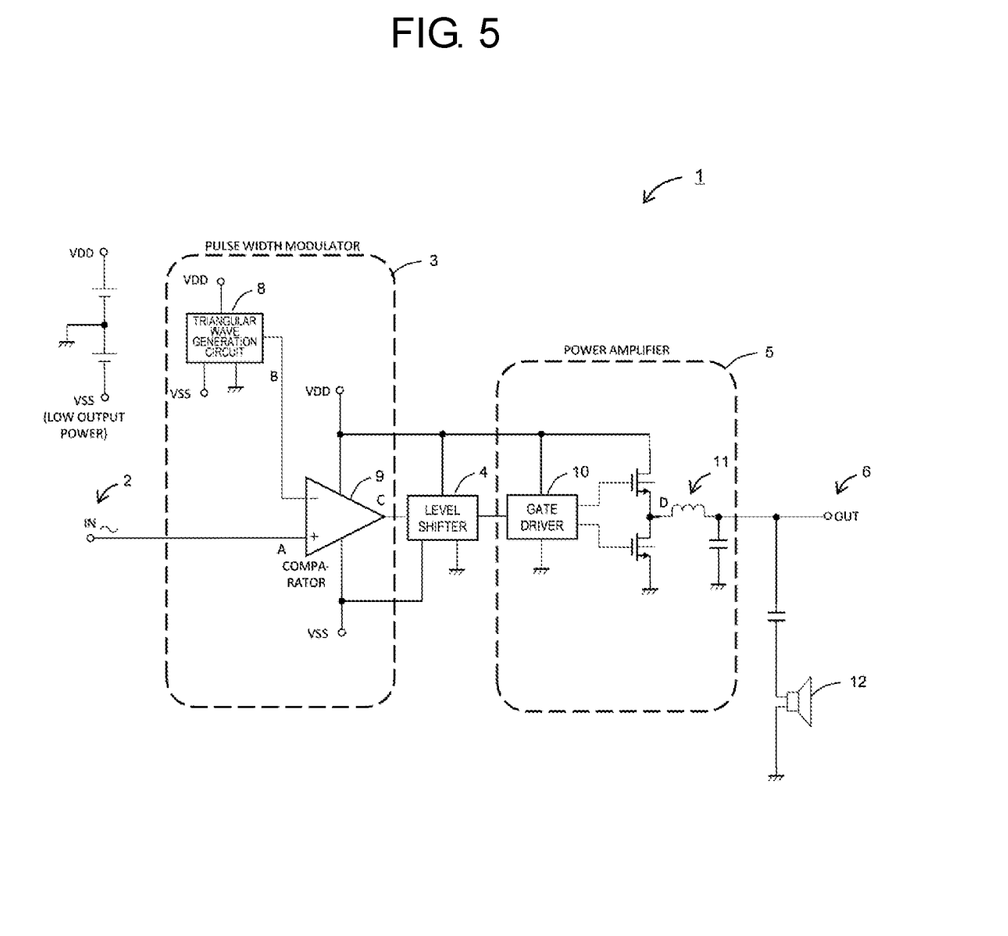
FIG. 5 is a circuit diagram illustrating an example of a signal amplifier according to a fourth exemplary embodiment of the present disclosure.

FIG. 5 is a circuit diagram illustrating an example of signal amplifier 1 according to a fourth exemplary embodiment. As illustrated in FIG. 5, in signal amplifier 1 according to the fourth exemplary embodiment, an analog input signal of a single-ended form (input differential signal IN) is input to signal input unit 2, and an analog output signal of a single-ended form (output differential signal OUT) is output from signal output unit 6.

Signal amplifier 1 according to the fourth exemplary embodiment can also exert an effect similar to the first exemplary embodiment. In the present exemplary embodiment, a single-ended-input/single-ended-output amplifier can be achieved. In other words, when the analog input signal of the single-ended form is input from signal input unit 2, the analog output signal of the single-ended form is output from signal output unit 6.

As described above, the exemplary embodiments according to the present disclosure have been described as illustration. However, the scope of the present disclosure is not limited to the exemplary embodiments, and can be modified or changed according to objects within the scope described in the claims.

Figure 6:
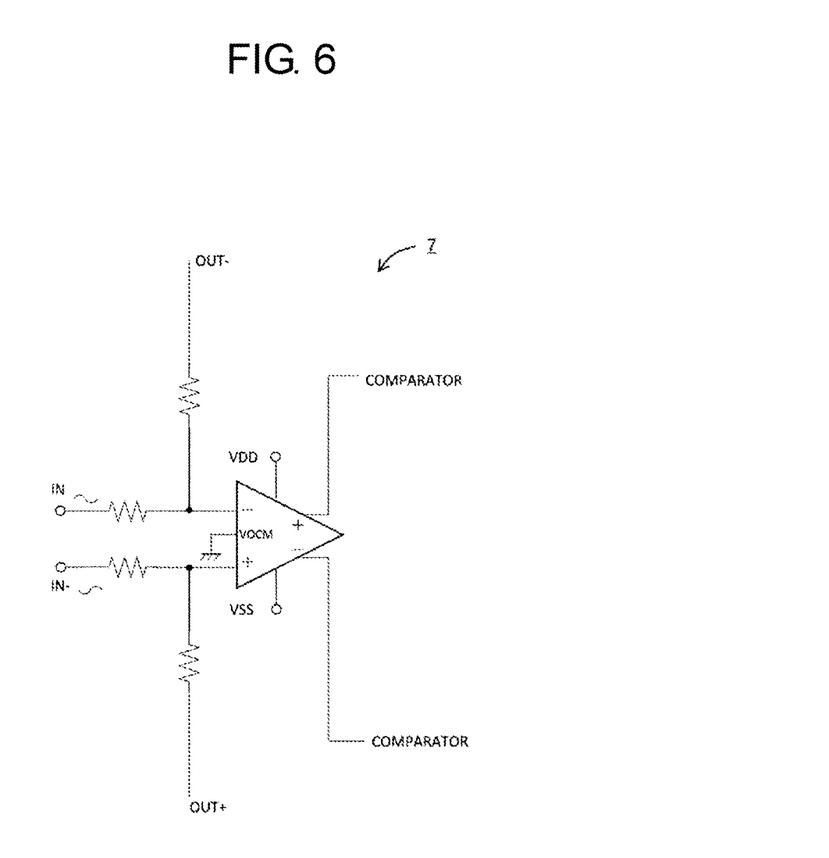
FIG. 6 is a circuit diagram illustrating an example of an error amplifier according to the exemplary embodiments of the present disclosure.
Figure 7:
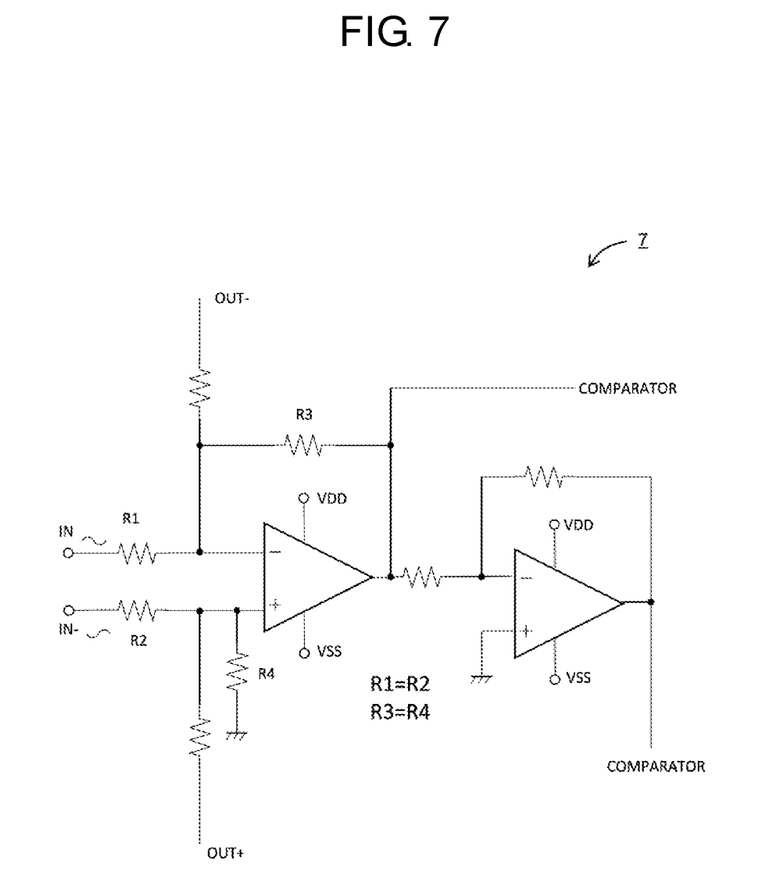
FIG. 7 is a circuit diagram illustrating another example of the error amplifier according to the exemplary embodiments of the present disclosure.

For example, in the above description, an example in which error amplifier 7 is configured with the fully-differential operational amplifier as illustrated in FIG. 6 has been described. However, error amplifier 7 can be configured with single-ended operational amplifiers as illustrated in FIG. 7.

As described above, the signal amplifier according to the present disclosure can prevent occurrence of noise or an increase in output impedance caused by use of the midpoint voltage as the reference voltage to prevent an adverse effect on the audio characteristic. The signal amplifier can also has an effect that prevents degradation of power efficiency and an increase in cost and circuit area that are caused by use of the negative power supply that supplies a large current. Therefore, the signal amplifier is useful to be used for a vehicle-mounted audio device and the like.

What is claimed is:
1. A signal amplifier, comprising:
   a signal input to which an analog input signal of a differential form is input;
   a pulse width modulator that performs pulse width modulation on the analog input signal input to the signal input to convert the analog input signal into a first pulse width modulation (PWM) signal;
   a level shifter that shifts a voltage level of the first PWM signal output from the pulse width modulator to convert the first PWM signal into a second PWM signal;
   a power amplifier that performs power amplification on the second PWM signal output from the level shifter to generate an analog output signal of a differential form from the second PWM signal;
   a signal output that outputs the analog output signal of a differential form; and
   an error amplifier to which the analog input signal is input and to which the analog output signal output from the signal output is input by being fed back and input to the error amplifier, wherein the error amplifier outputs an error amplification signal that is generated by amplifying an error component between the analog input signal input to the error amplifier and the analog output signal fed back and input to the error amplifier, the pulse width modulator is driven by a positive power supply and a negative power supply, and a reference voltage of the pulse width modulator is set to a ground (GND), the pulse width modulator outputs the first PWM signal having a pulse width corresponding to a signal level of the error amplification signal, the power amplifier is driven by the positive power supply, and a reference voltage of the power amplifier is set to a middle value between the positive power supply and the GND, and the level shifter shifts the voltage level of the first PWM signal whose high level corresponds to the positive power supply of the pulse width modulator and whose low level corresponds to the negative power supply of the pulse width modulator, to a voltage level of the second PWM signal whose high level corresponds to the positive power supply of the power amplifier and whose low level corresponds to the GND.

* * * * *